United States Patent
Ng et al.

(10) Patent No.: US 6,179,648 B1
(45) Date of Patent: Jan. 30, 2001

(54) CONNECTOR ASSEMBLY AND MALE CONNECTOR ASSEMBLY ASSOCIATED THEREWITH

(75) Inventors: Siew In Ng; Chee Ghee Cheah, both of Penang (MY)

(73) Assignee: Motorola, Inc., Schaumburg, IL (US)

( * ) Notice: Under 35 U.S.C. 154(b), the term of this patent shall be extended for 0 days.

(21) Appl. No.: 09/359,899

(22) Filed: Jul. 26, 1999

(51) Int. Cl.[7] .................................................. H01R 9/07
(52) U.S. Cl. ............................................. 439/496; 439/495
(58) Field of Search ..................................... 439/496, 495, 439/83, 67, 493, 494, 630, 637, 632, 329, 350

(56) References Cited

U.S. PATENT DOCUMENTS 5,403,202 * 4/1995 Roehling ............................... 439/493
5,690,510 * 11/1997 Chishima ............................... 439/496

* cited by examiner

Primary Examiner—Paula Bradley
Assistant Examiner—Alexander Gilman
(74) Attorney, Agent, or Firm—Dale W. Dorinski

(57) ABSTRACT

A male connector assembly (1) has a former (2) and a foldable substrate (3) supporting leads (4) that are electrically coupled to respective connector pads (5). The substrate (3) is folded adjacent at one end to provide a connector portion (13), with opposite inwardly facing surfaces are adhered to the former (2). The male connector assembly (1) has mounting pads (15) to which are mounted respective spherical solder deposits (16).

When connector assembly (1) engages a socket (21), a connector assembly (20) Is provided in which the spherical solder deposits (16) engage recesses (24) and connector pads (5) are electrically coupled to electrical contacts (25) of socket (21).

8 Claims, 3 Drawing Sheets

CONNECTOR ASSEMBLY AND MALE CONNECTOR ASSEMBLY ASSOCIATED THEREWITH

FIELD OF THE INVENTION

This invention relates to a connector assembly and an associated male connector assembly. The invention is particularly useful for, but not necessarily limited to, releasibly connecting flexible flat electrically conductive strips to circuit boards and the like.

BACKGROUND ART

When releasibly connecting conductors such as wires of flat strips to a circuit board, the connector used is usually relatively expensive to manufacture.

Examples indicative of prior art connectors include U.S. Pat. No. 5,816,831. This patent describes an assembly for mounting electrical connectors on an edge of a circuit board. The assembly has a fastener that is typically a pair of molded blocks each having a rear groove and ledge.

Another example of prior art connectors is described in U.S. Pat. No. 5,846,094. In this patent a connector assembly comprising a molded elastomeric connector for connecting adjacent circuits boards is described.

In U.S. Pat. No. 5,281,166 another connector assembly is described. This connector has a locking arrangement comprising resilient fingers that engage apertures on a circuit board.

The prior art connectors and connector assemblies are usually relatively expensive to manufacture. It would therefore be useful if an alternative connector and connector assembly was made available.

SUMMARY OF THE INVENTION

According to one aspect of this invention there is provided a male connector assembly comprising:

a former;

a foldable substrate supporting a plurality of elongate electrical conductors that are electrically coupled to respective connector pads, said substrate being folded adjacent on end thereof to provide a connector portion, wherein opposite inwardly facing surfaces of said connector portion are adhered to said former;

one or more mounting pads associated with an outer facing surface of said connector portion; and at least one solder deposit protruding from a respective one of said mounting pads.

Preferably, said solder deposit in substantially spherical.

Suitably, said former is substantially rigid. Alternatively, said former may preferably be resilient.

Preferably, said electrical conductors are covered along a length thereof.

Suitably, a length of said electrical conductors are uncovered at said connector portion to provide said connector pads.

Preferably, said connector pads are associated with an opposite outer facing surface to the surface associated with said mounting pads A connector assembly comprising:

a former;

a foldable substrate supporting a plurality of elongate electrical conductors that are electrically coupled to respective connector pads, said substrate being folded adjacent on end thereof to provide a connector portion, wherein opposite inwardly facing surfaces of said connector portion are adhered to said former;

a plurality of mounting pads associated with an outer facing surface of said connector portion;

at least one solder deposit protruding from a respective one of said mounting pads;

a socket engaging said connector portion;

at least one recess in a wall of said socket for engaging a respective said solder deposit; and electrical contacts associated with said socket, said electrical contacts being electrically coupled to one or more respective ones of said connector pads.

Suitably, said former is substantially rigid and said electrical contacts are biased. Alternatively, said former may preferably be resilient.

Preferably, said electrical conductors are covered along a length thereof.

Suitably, a length of said electrical conductors are uncovered at said connector portion to provide said connector pads.

Preferably, said connector pads are associated with an opposite outer facing surface to the surface associated with said mounting pads.

Preferably, said socket is mounted to a circuit board.

BRIEF DESCRIPTION OF THE DRAWINGS

In order that the present invention may be readily understood and put into practical effect, reference will now be made to a preferred embodiment illustrated in the accompanying drawings in which.

DETAILED DESCRIPTION OF THE PREFERRED EMBODIMENT OF THE INVENTION

Figure 1:
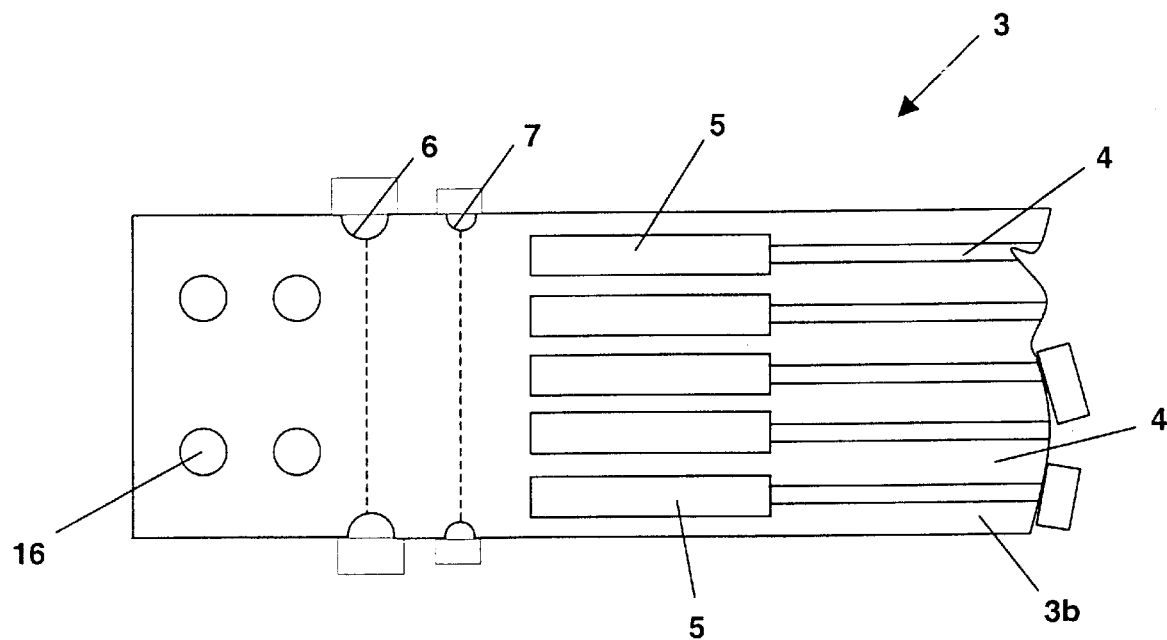
FIG. 1 is a plan view of a preferred embodiment of part of a male connector assembly in accordance with the present invention.
Figure 2:
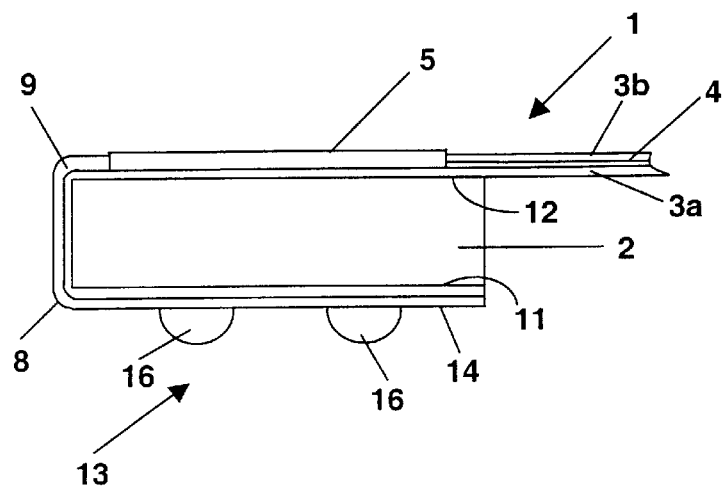
FIG. 2 is a side view of a preferred embodiment of a male connector assembly in accordance with the present invention.
Figure 3:
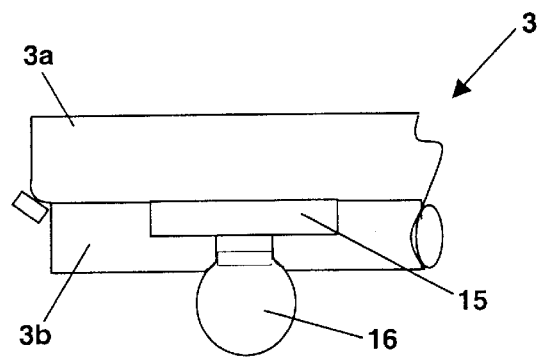
FIG. 3 is a side view illustrating a spherical solder deposit used in the preferred embodiment of the connector assembly of FIG. 2.

In the drawings, like reference numerals refer to like parts. Referring to FIGS. 1 to 3 there is illustrated a male connector assembly 1 comprising a rigid former 2 and a foldable substrate 3 in the form of a flexible support encapsulating and supporting elongate electrical conductors in the form of leads 4. The leads 4 are each electrically coupled to a respective electrical contact in the form of elongate connector pads 5 that are coated with solder and therefore slightly protrude from substrate 3. The substrate 3 is folded adjacent one end by use of weakened sections 6,7 that provide respective corner bends 8,9. The substrate 3 is folded and mounted to the former 2 by an adhesive applied to two inwardly facing surfaces 11,12 of the substrate 2 that abut former 2.

The folding and mounting of substrate 3 to former 2 provides a connector portion 13 of said substrate 3. Associated with an outer facing surface 14 of the connector portion 13 are mounting pads 15 with respective spherical solder deposits 16 protruding therefrom. As illustrated, the foldable substrate 3 comprises two parts 3a,3b with leads 4 sandwiched and covered therebetween. However, the leads 4 are uncovered at the connector portion 13 to provide the elongate connector pads 5 that are associated with an opposite outer facing surface to the surface associated with said mounting pads 15.

Figure 4:
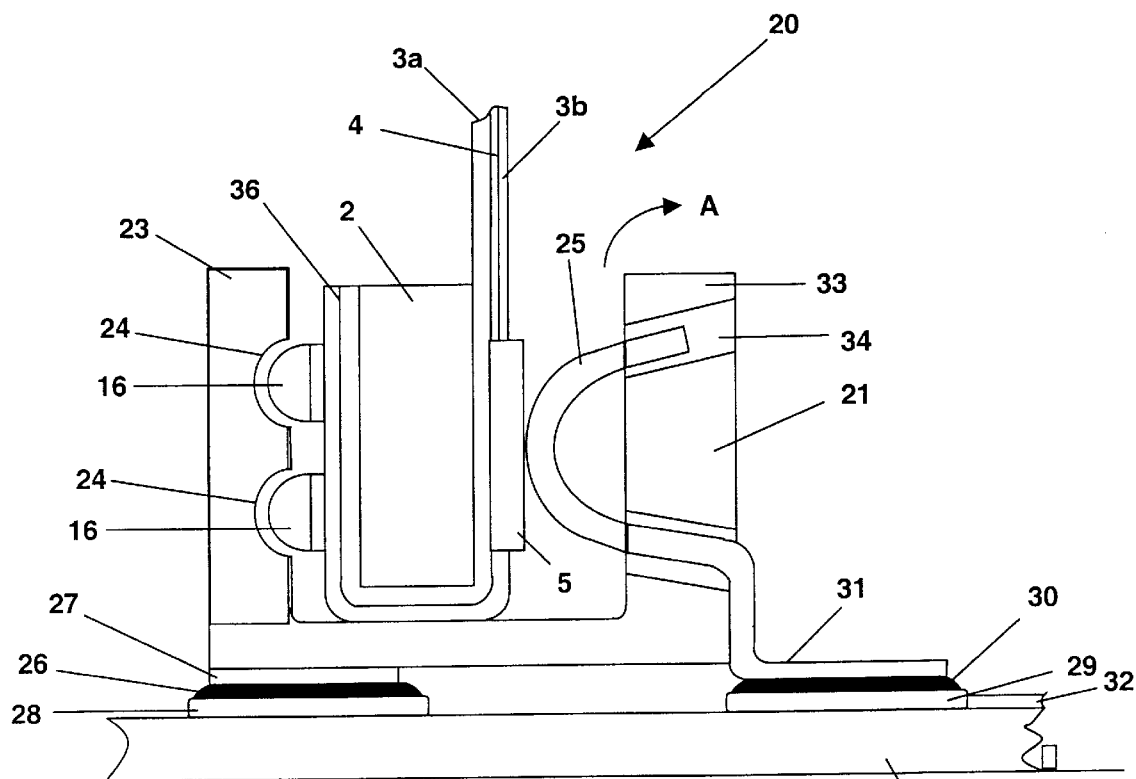
FIG. 4 is a cross sectional side view of a connector assembly including the male connector assembly of FIG. 2.
Figure 5:
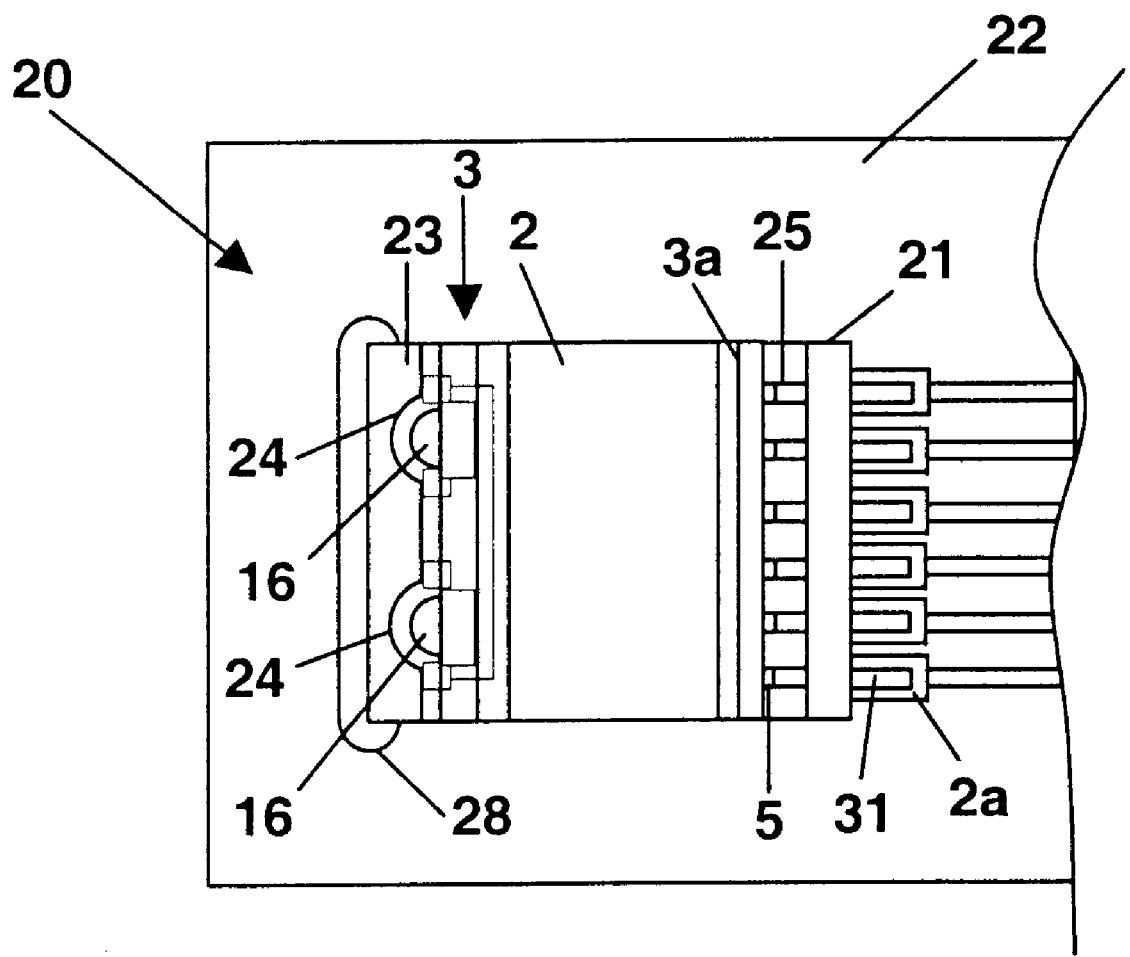
FIG. 5 is a cross sectional top plan view of the connector assembly of FIG. 4.

In FIG. 4 there is illustrated a connector assembly 20 including male connector assembly 1 in which the connector portion 13 engages a socket 21 mounted to a circuit board 22 by a solder joint 26 between respective circuit board and socket mounting pads 27,28. A wall 23 of socket 21 has recesses 24 that are complementary in shape to and engage with the solder deposits 16 to provide a relatively secure engagement of connector assembly 1 into socket 21. The socket 21 also has biased electrical contacts 25 that are electrically coupled to respective pads 29 by a solder joint 30 at an external portion 31 of the contacts 25. As will be apparent to a person skilled in the art, each pad 29 has an associated runner 32 on the circuit board 22 for electrically connecting contacts 25 with other electrical components such as transistors, microprocessors, operational amplifiers, resistors, inductors, capacitors as well as many other types of components.

As described, the electrical contacts 25 are biased and can move in a direction illustrated by arrow A, in a respective aperture in a socket wall 33, to allow the male connector assembly 1 to be readily inserted into socket 21. The biased contacts 25 allow for a suitable electrical contact with a respective pad 5 and also provide, in combination with the solder deposits 16 and recesses 24 secure engagement of the male connector assembly 1 in socket 21. However, a similar secure engagement and suitable electrical contact could be provided by the former 2 having resilient properties and contacts 25 being rigid. Further, a resilient former 2 made from rubber would also allow for the male connector assembly to be readily inserted into socket 21.

Advantageously, the present invention provides a relatively inexpensive connector assembly that can be simply released to allow maintenance or replacement of a circuit board. Further, the male connector assembly 1 can be manufactured without the need for complex injection molded components and the solder deposits 16 can be simply replaced if they are damaged.

Although the invention has been described with reference to a preferred embodiment it is to be understood that the invention is not restricted to the embodiment described herein.

We claim:

1. A connector assembly comprising:

a former;

a foldable substrate supporting a plurality of elongate electrical conductors that are electrically coupled to respective connector pads, said substrate being folded adjacent on end thereof to provide a connector portion, wherein opposite inwardly facing surfaces of said connector portion are adhered to said former;

a plurality of mounting pads associated with an outer facing surface of said connector portion;

at least one solder deposit protruding from a respective one of said mounting pads;

a socket engaging said connector portion;

at least one recess in a wall of said socket engaging a respective said solder deposit thereby securing said connector portion in said socket; and electrical contacts associated with said socket, said electrical contacts being electrically coupled to one or more respective ones of said connector pads.

2. A connector assembly as claimed in claim 1, wherein said former is substantially rigid and said electrical contacts are biased .

3. A connector assembly as claimed in claim 1, wherein said former is resilient.

4. A connector assembly as claimed in claim 1, wherein said electrical conductors are covered along a length thereof.

5. A connector assembly as claimed in claim 4, wherein a length of said electrical conductors are uncovered at said connector portion to provide said connector pads.

6. A connector assembly as claimed in claim 1, wherein said connector pads face a direction that is opposite to a direction faced by said mounting pads.

7. A connector assembly as claimed in claim 1, wherein said socket is mounted to a circuit board.

8. A male connector assembly as claimed in claim 8, wherein said solder deposit in substantially spherical.

* * * * *